United States Patent
Hogg

(10) Patent No.: US 6,895,571 B2
(45) Date of Patent: May 17, 2005

(54) NANOMETER SCALE DEVICES

(75) Inventor: Tad Hogg, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 82 days.

(21) Appl. No.: 10/242,405

(22) Filed: Sep. 13, 2002

(65) Prior Publication Data

US 2004/0054978 A1 Mar. 18, 2004

(51) Int. Cl.⁷ .............................................. G06F 17/50
(52) U.S. Cl. .......................................... 716/21; 716/12
(58) Field of Search ................................ 716/9, 12–13, 716/21

(56) References Cited

U.S. PATENT DOCUMENTS

| | | | | |
|---|---|---|---|---|
| 5,050,069 A | * | 9/1991 | Hillis et al. | 703/13 |
| 5,960,468 A | * | 9/1999 | Paluch | 711/219 |
| 5,987,574 A | * | 11/1999 | Paluch | 711/158 |
| 6,256,767 B1 | * | 7/2001 | Kuekes et al. | 716/9 |
| 6,706,626 B2 | * | 3/2004 | Huang | 438/653 |
| 6,720,247 B2 | * | 4/2004 | Kirkpatrick et al. | 438/622 |

* cited by examiner

Primary Examiner—Vuthe Siek
Assistant Examiner—Paul Dinh

(57) ABSTRACT

In a method of creating connections in nanometer scale devices, address lines and nanometer scale data wires are formed on a wafer. In addition, connections are patterned between the address lines and the nanometer scale data wires according to at least one bit change between successive nanometer scale data wires.

24 Claims, 6 Drawing Sheets

NANOMETER SCALE DEVICES

FIELD OF THE INVENTION

This invention relates generally to electronic devices having data wires whose functional length scales are measured in nanometers.

DESCRIPTION OF THE RELATED ART

Electronic circuits at nanometer scale (nanoscale) offer the possibility of high density, high speed, and low cost. However, in nanoscale circuits (or devices) one problem is the establishment of an efficient communication circuitry for input into and output from the nanoscale circuits. To solve this problem, multiplexers/demultiplexers can be introduced as the interfacial circuits, i.e., provide an interface between the nanoscale device and other conventional circuitry.

Conventional microelectronics having a multiplexer-demultiplexer circuit can establish a substantially efficient interfacial circuitry. The fabrication of the multiplexer-demultiplexer circuit as a nanoscale circuit generally requires that the nanowires and addressing wires be selectively connected and/or disconnected at each cross point. However, fabrication of this logic element with conventional nanotechnology techniques at the intersections at nanometer scale has been found to be relatively difficult. More particularly, conventional photolithographic techniques have insufficient resolution to precisely layout the connections between the address lines and nanoscale data wires. In addition, conventional photolithographic techniques can only mask or expose regions containing many nanoscale data wires and may thus create a number of random connections between the address lines and the nanoscale data wires. One drawback of creating random connections is that it increases the number of addressing wires.

One possible solution to the above-identified drawback may be to space the nanoscale data wires at relatively long distances from each other. However, this solution may be inadequate as it may prevent the nanoscale device from having a relatively denser configuration than is possible with conventional lithographic techniques.

A conventional interfacial circuit 600 is shown in FIG. 6, in which eight nanowires 620 (marked as 1–8) can be addressed by six address lines 610 (marked as A–F). The address lines 610 may comprise a binary system in which address lines A, C, and E constitute 1's and address lines B, D, and F constitute 0's. The blocks 630 represent connections between the nanowires 620 and the address lines 610. The blocks 630 may each represent a two-way AND, which may be implemented as a resistor, diode, transistor, or other similar electronic device. The input signals may be any combination from A–F (e.g., 1, 1, 1 for A, C, E, respectively, addresses the nanowire 1, and so on).

FIG. 6 shows that the size of groups of data wires 620 with the same connection (e.g., connections to data wires 1–4 on the addressing wire A) decreases as the addressing moves from the most to least significant bits. If, for example, the minimum mask size corresponds to two nanowires, this addressing could not be fabricated. Instead, the connections for the last bit would have to be replaced by random connections along with a corresponding increase in the number of addressing wires to ensure unique addresses.

FIG. 6 also shows the boundaries involving many wires in this layout. In particular, between data wires 4 and 5, the connections on all the addressing wires change. This may lead to alignment errors in the masks, such as, too few or too many connections for data wires 4 or 5. One problem with this approach is the lack of precision of the boundaries of the masks, which may cause some of the data wires 620 to always be addressed or never addressed. This problem may be particularly significant for wires falling near the boundary of many of the mask windows, e.g., data wires 4 and 5 are on the boundary (i.e., a location where values in a row change between 0 and 1) of all of the addressing wires 610.

SUMMARY

An embodiment of the invention pertains to a method of creating connections in nanometer scale devices. In the method, address lines and nanometer scale data wires are formed on a wafer. In addition, connections are patterned between the address lines and the nanometer scale data wires according to at least one bit change between successive nanometer scale data wires.

Another embodiment of the invention relates to a nanometer scale circuit. The nanometer scale circuit includes address lines adapted to interface with input/output pads and nanometer scale data wires adapted to interface with a nanoscale device. The address lines are connected to the nanometer scale data wires and the connections between the address lines and the nanometer scale data wires are configured according to a pattern where there exists at least one bit change between successive nanometer scale data wires.

A further embodiment of the invention pertains to a computer readable storage medium on which is embedded one or more computer programs. The one or more computer programs are configured to implement a method of creating connections in nanometer scale devices. The one or more computer programs include a set of instructions for forming address lines on a wafer and forming nanometer scale data wires on the wafer. The one or more computer programs also include a set of instructions for patterning connections between the address lines and the nanometer scale data wires according to at least one bit change between successive nanometer scale data wires.

A yet further embodiment pertains to an apparatus for patterning nanometer scale circuits. The apparatus includes means for forming address lines on a wafer; means for forming nanometer scale data wires on the wafer, and means for patterning connections between the address lines and the nanometer scale data wires according to at least one bit change between successive nanometer scale data wires.

Yet another embodiment pertains to a stepper for photolithography of devices. The stepper includes an imaging source and a controller. The controller is configured to direct the imaging source to expose a photoresist covering address lines. The controller is further configured to create connections between the address lines and one or more nanometer scale data wires according to at least one bit change between successive nanometer scale data wires.

BRIEF DESCRIPTION OF THE DRAWINGS

Various features of the embodiments can be more fully appreciated, as the same become better understood with reference to the following detailed description when considered in connection with the accompanying figures, in which.

DETAILED DESCRIPTION OF A PREFERRED EMBODIMENT

Figure 1:
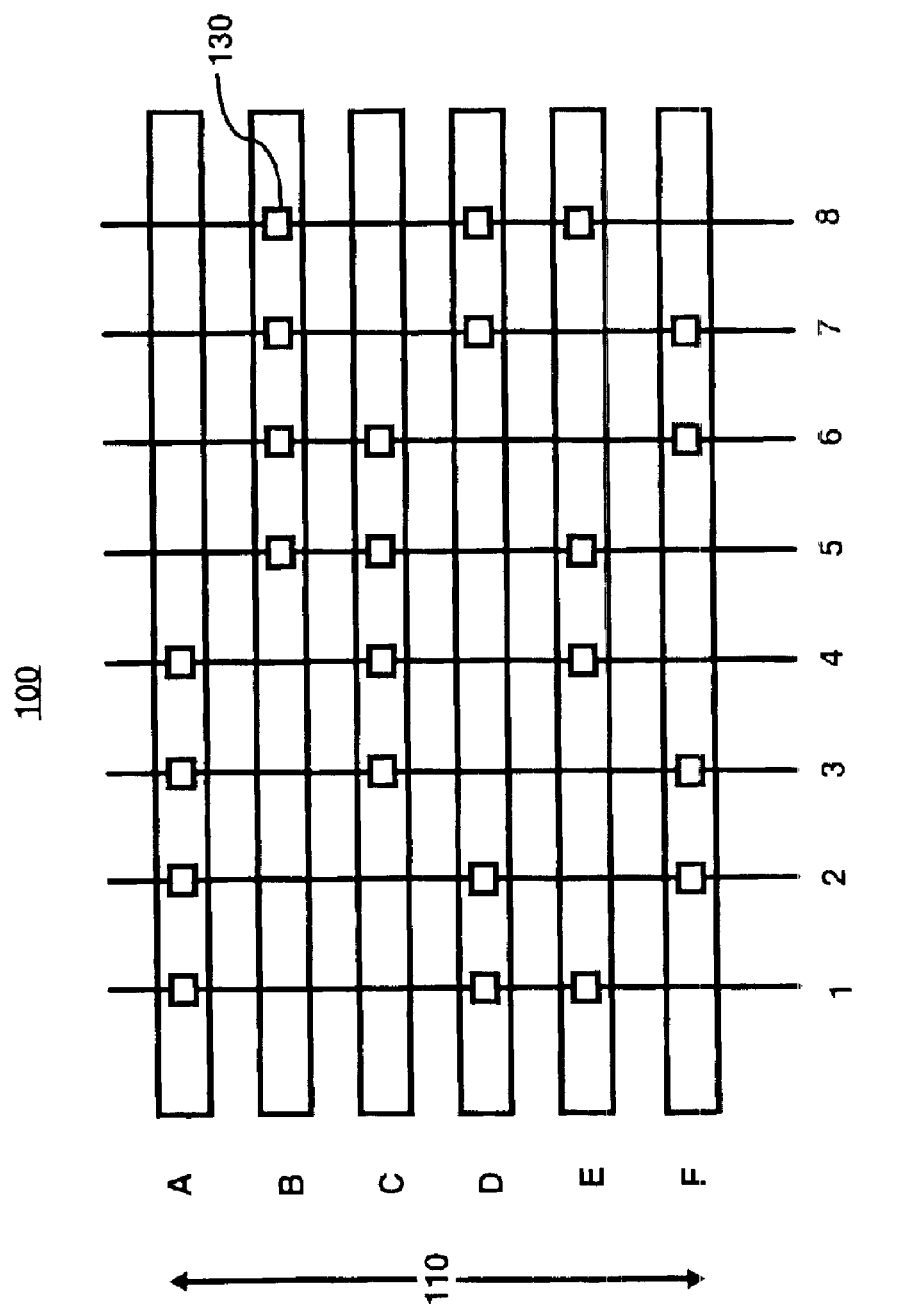
FIG. 1 illustrates an interfacial circuit constructed in accordance with an embodiment of the invention.

For simplicity and illustrative purposes, certain principles of the present invention are described by referring mainly to an exemplary embodiment thereof. However, one of ordinary skill in the art would readily recognize that the same principles are equally applicable to, and can be implemented in, all types of electronic devices, and that any such variations do not depart from the true spirit and scope of the present invention. Moreover, in the following detailed description, references are made to the accompanying figures, which illustrate specific embodiments in which the present invention may be practiced. Electrical, mechanical, logical and structural changes may be made to the embodiments without departing from the scope of the present invention. The following detailed description is, therefore, not to be taken in a limiting sense and the scope of the present invention is defined by the appended claims and their equivalents.

Embodiments of the invention relate generally to reducing fabrication errors and increasing density in nanoscale devices. Moreover, embodiments of the invention relate to methods of forming connections between data wires having widths on the order of several nanometers and addressing wires having widths that are one or two orders of magnitude higher than the data wires, e.g., the addressing wires have sufficient widths to enable production thereof through lithography.

Further embodiments of the invention relate to methods of forming connections between address lines and data wires following a Gray code pattern. For illustrative purposes, consider the address lines and the data wires in a two-dimensional Cartesian space, where the address lines are oriented in the x-axis and the data wires oriented in the y-axis. The address lines are also phase split across the data wires, i.e., each address line provides a signal and a complement of the signal across the data wires. In order to select a particular data wire, a combination of the address lines may be activated. The methods include patterning the connection between the address lines and the data wires following a Gray code pattern. A Gray code orders the addresses so each address differs by exactly one bit from the next address. Examples of algorithms for constructing Gray codes may be found, for instance, in A. Nijenhuis and H. S. Wilf, COMBINATORIAL ALGORITHMS FOR COMPUTERS AND CALCULATORS, Academic Press, 1978, the disclosure of which is hereby incorporated by reference in its entirety.

In another embodiment of the present invention, a stepper may be programmed to expose a layout for interfacial circuits on a photoresist between nanoscale devices and outside signals. For a given interface circuit of address lines and data wires, the stepper may create a pattern on a mask to form connections between the address lines and data wires of the interface circuit that follows an N-bit Gray code pattern.

Yet another embodiment relates to an interfacial circuit. The interfacial circuit comprises address lines and data wires. The connections between the address lines and data wires are formed following an N-bit binary Gray code. The interfacial circuit may be a multiplexer or demultiplexer adapted to provide an interface to a nanoscale device.

FIG. 1 illustrates an interfacial circuit 100, e.g., a multiplexer or a demultiplexer, constructed in accordance with an embodiment of the invention. As shown in FIG. 1, the interfacial circuit 100 includes address lines 110 (A–F) and data wires 120 (1–8). The address lines 110 may comprise a binary system in which address lines A, C, and E constitute 1's and address lines B, D, and F constitute 0's. It should be understood that the number of address lines 110 and data wires 120 may vary according to individual requirements and that, in general, an N number of addressing lines 110 may interface with $2^N$-data wires 120. Therefore, although a specific number of addressing lines 110 and data wires 120 are illustrated in FIG. 1, it should be understood that the invention is not to be limited to the specific depiction.

The address lines 110 and data wires 120 are implemented by conducting materials. The data wires 120 may be on the order of $10^{-9}$ meters and the address lines 110 may be one or two orders of magnitude wider than the data wires 120. The address lines 110 may be of sufficient width to be fabricated with lithography, whereas the data wires 120 may be fabricated through nanoscale technologies, e.g., self-assembly. In addition, the connections 130 between the address lines 110 and the data wires 120 may be also formed using nanoscale device fabrication techniques. Suitable fabrication and connection techniques are disclosed and described in U.S. Pat. No. 6,256,767, to Kuekes et al., entitled "DEMULTIPLEXER FOR A MOLECULAR WIRE CROSSBAR NETWORK (MWCN DEMUX)", which is assigned to the present assignee, and the disclosure of which is hereby incorporated by reference in its entirety.

According to embodiments of the invention, the connections between the address lines 110 and the data wires 120 may be formed in a pattern following an N-bit Gray code, where N is a positive integer. A Gray code is an ordering of the patterns such that only one bit changes from one entry to the next. In FIG. 1, an address input of 1, 0, 1 (A, D, E) selects data wire 1 and, similarly, an address input of 1, 0, 0 (A, D, F) selects data wire 2. As can be seen in comparing the connections 130 along data wires 1 and 2, the difference between the address inputs comprises a single bit change. The address inputs for subsequent data wires 3–8 also comprise single bit changes.

Embodiments of the invention are, however, not limited to the use of Gray code patterning. Instead, it should be understood that embodiments of the invention may include patterns that include two or more bit changes. In this respect, the use of the terms "Gray code" throughout the present disclosure is not meant to limit the invention in any respect, but rather as a relatively shorthand manner of describing nanoscale device fabrication techniques having N-bit changes between adjacent addresses. In addition, it should also be understood that in a given fabrication, the bit changes are not required to remain the same and therefore, the bit changes may be varied.

Furthermore, it should be understood that all of the connections in a nanoscale device need not be fabricated according to Gray code patterning. Instead, certain areas of the nanoscale device may be fabricated using lithographic processes while other areas may be fabricated using N-bit Gray code patterning according to embodiments of the invention. By way of example, and not of limitation, the N-bit Gray code patterning may be implemented for less significant bits of the address, e.g., where it may be relatively difficult or impossible to fabricate using lithography. By way of example, in those areas where the mask size is too small to accurately produce connections through lithography.

Figure 6:
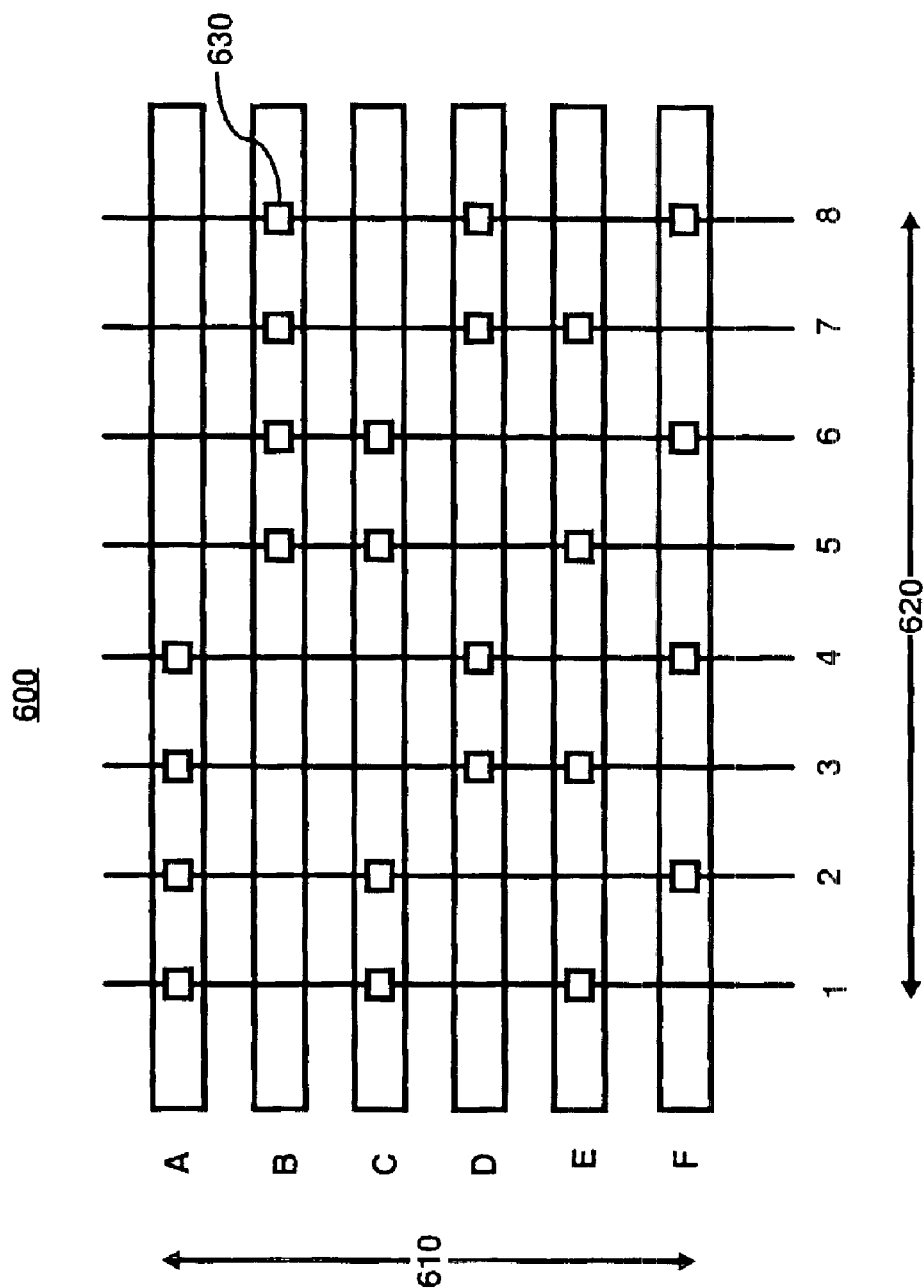
FIG. 6 illustrates a conventional interfacial circuit.

As shown in FIG. 1, the addresses are arranged in a manner to enable the boundaries between adjacent addresses to be staggered. This may be accomplished through use of Gray code ordering for the addresses in which, only a single bit changes between successive addresses. In comparison to FIG. 6, therefore, illustrated in FIG. 1, there is a single addressing bit change between addressing lines A and B located between data wires 4 and 5.

In addition to eliminating boundaries involving several addressing lines at once, the layout depicted in FIG. 1 doubles the size of the blocks of 0's or 1's in each row after the first row. Although this doubling does not occur for the blocks at either end of each row, the corresponding masks could be extended beyond the edge of the array without any effect since such extensions would not cover any data wires. This layout, therefore, enables the use of masks to make correct connections for one more addressing wire than is possible with the original layout. For instance, if the minimum mask corresponds to two nanowires, in this case random connections would not be required since the layout no longer requires masks of smaller size. Instead, all of the connections may formed directly with lithography.

Figure 2A:
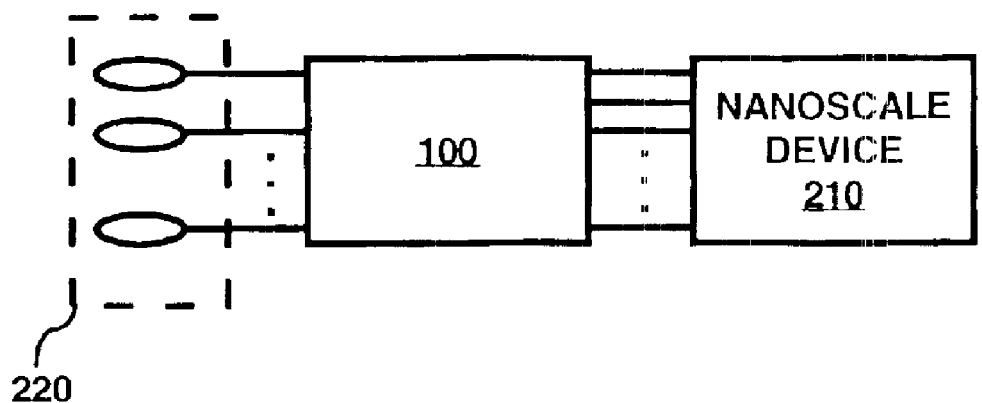
FIG. 2A illustrates a system where an embodiment of the invention may be practiced.

FIG. 2A illustrates a system 200 where an embodiment of the invention may be practiced. It should be readily apparent to those of ordinary skill in the art that the system 200 depicted in FIG. 2A represents a generalized schematic illustration and that other components may be added or existing components may be removed or modified.

As shown in FIG. 2A, the system 200 includes the interfacial circuit 100 interfaced between a nanoscale device 210 and I/O pads 220. The I/O pads 220 may be adapted to provide an interface with the nanoscale device 210 through the interfacial circuit 100. The I/O pads 220 may be included as part of, for example, a chip carrier.

The nanoscale device 210 may be any electrical device, mechanical device, or combination thereof constructed with nanotechnology. The typical scale of these devices may range from a few nanometers to hundreds of nanometers.

Figure 2B:
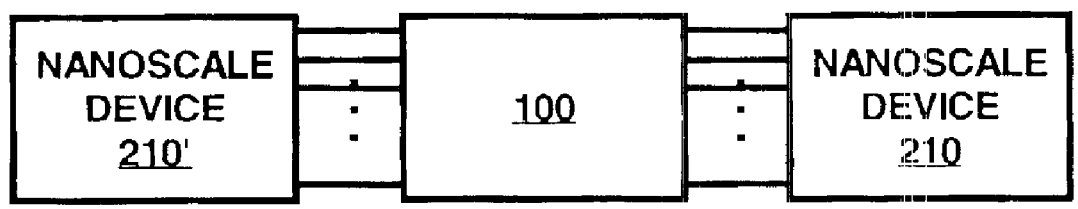
FIG. 2B illustrates another system where an embodiment of the invention may be practiced.

FIG. 2B illustrates another system 200' where an embodiment may be practiced. It should be readily apparent to those of ordinary skill in the art that the system 200' depicted in FIG. 2B represents a generalized schematic illustration and that other components may be added or existing components may be removed or modified.

As shown in FIG. 2B, the interfacial circuit 100 may be interfaced between two nanoscale devices 210, 210'. In this embodiment, the interfacial circuit 100 may provide a means for one nanoscale device (e.g., 210') to control the output/input of the second nanoscale device (e.g., 210).

Figure 3:
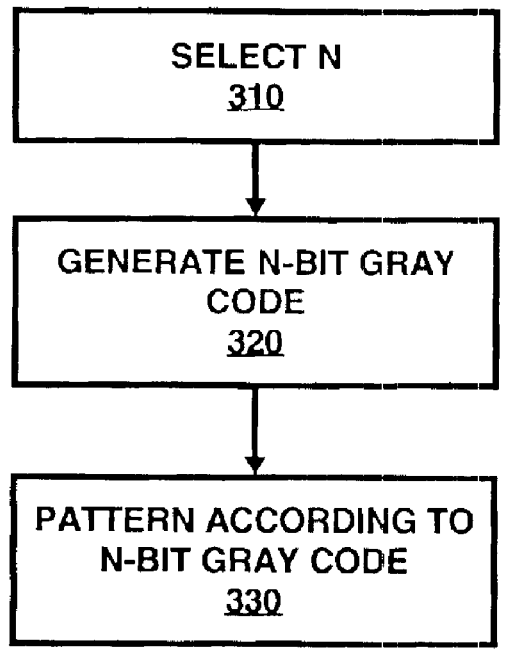
FIG. 3 illustrates a method in accordance with yet another embodiment of the invention.

FIG. 3 illustrates a method 300 in accordance with another embodiment of the invention. It should be readily apparent to those of ordinary skill in the art that the method 300 represents a generalized illustration and that other steps may be added or existing steps may be removed or modified without departing from the scope of the invention.

As shown in FIG. 3, the method 300 is configured to provide a mechanism for the selection of a number of bits, N, to generate a Gray code, in step 310. By way of example, a selection criterion for the choice of the number of bits may be the number of address lines for the interfacial circuit 100.

In step 320, the method 300 may be configured to generate the selected N-bit Gray code. In one embodiment, a random N-bit number may be chosen as a seed value and one bit change at a time may generate the remainder of the Gray code. In another embodiment, an N-bit seed value may be predetermined.

In step 330, the generated N-bit Gray code may be applied to the interfacial circuit 100 to form the connections between the address lines (e.g., 110 in FIG. 1) and the data wires (e.g., 120 in FIG. 1).

Figure 4:
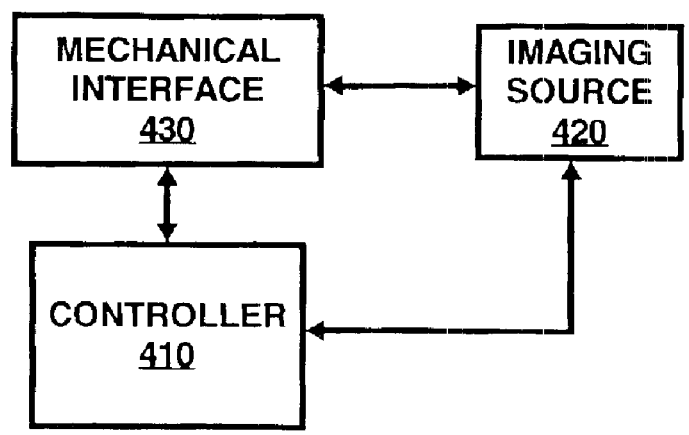
FIG. 4 illustrates a stepper in accordance with yet another embodiment of the invention.

FIG. 4 illustrates a stepper 400 in accordance with another embodiment of the invention. It should be readily apparent to those of ordinary skill in the art that the stepper 400 depicted in FIG. 4 represents a generalized schematic illustration and that other components may be added or existing components may be removed or modified without departing from the scope of the invention.

As shown in FIG. 4, the stepper 400 includes a controller 410, an imaging source 420 and a mechanical interface 430. The stepper 400 may be implemented in lithographic processes in the manufacture of nanoscale devices. More specifically, steppers, in general, provide a means for imaging the layout of the nanoscale devices onto a substrate.

The controller 410 may be configured to provide the functionality of the stepper 400. The controller 410 may be implemented with a microprocessor, controller, ASIC, or other similar processing device.

The controller 410 may interface with the imaging source 420. The imaging source 420 may operate to expose a photoresist that is applied to a substrate. The imaging source 420 may be a deep ultraviolet source, an x-ray source, or other focused electromagnetic wave energy device.

The controller 410 may also interface with the mechanical interface 430. The mechanical interface 430 may provide a communication conduit between the controller 410 and the mechanical components (not shown) of the stepper 400. The mechanical components may move a base and/or imaging source 420 which supports the substrate in the exposure process.

Although the stepper 400 is described as being configured to provide a means for imaging the layout of the nanoscale devices onto a substrate, it should be understood that the fabrication of the nanowires may be accomplished as described hereinabove (e.g., the nanoscale technologies described in U.S. Pat. No. 6,256,767, issued to Kuekes et al.

The controller 410 may implement method 300, which is fully described above. Method 300 may be implemented as a software program, subroutine, a function call or other similar programming construct. Method 300 may also be implemented as a hardware component of the controller 410, either integrated with the controller 410 or as an additional module to the stepper 400.

FIGS. 5A–F, collectively, illustrate processing steps utilizing method 300 (shown in FIG. 3) and stepper 400 (shown in FIG. 4) for creating an interfacial circuit in accordance with embodiments of the invention. It should be readily apparent to those of ordinary skill in the art that this method 300 represents a generalized illustration and that other steps may be added or existing steps may be removed or modified without departing from the scope of the invention.

Figure 5A:
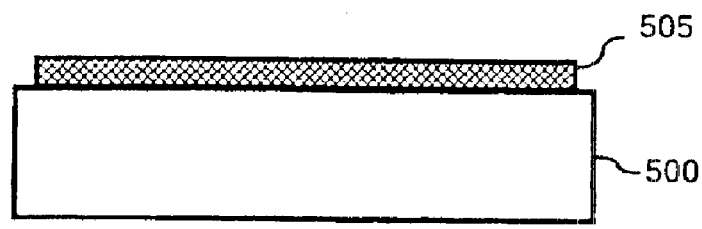
FIGS. 5A–F, collectively, illustrate processing steps utilizing method (shown in FIG. 3) and stepper (shown in FIG. 4) for creating an interfacial circuit in accordance with one embodiment of the invention.

As shown in FIG. 5A, a substrate 500 may comprise an insulating material that is part of a wafer. The substrate 500 may be grown with any reasonably suitable material, such as, silicon dioxide.

A photoresist 505 may be placed on top of the substrate 500 in any reasonably suitable manner. By way of example, the substrate 500 may be spun while a few drops of photoresist 505 is applied on the substrate 500 to generally enable the photoresist 505 to spread substantially evenly across the substrate 500. Subsequently, the stepper 400 may expose a layout for one of the N-address lines with the imaging source 420.

Figure 5B:
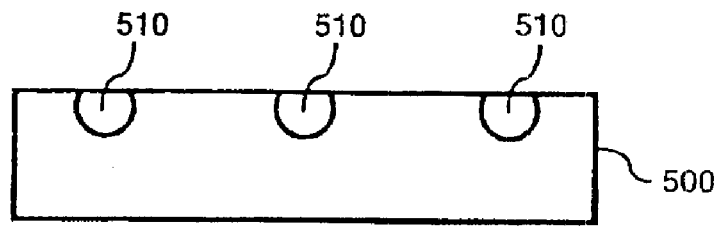

In FIG. 5B, the substrate 500 has been etched with an appropriate process to create metal runs 510 for the address lines. Metal is then deposited into the metal runs 510 to form the address lines. The data wires may be fabricated according to the nanometer scale techniques described in U.S. Pat. No. 6,256,767.

Figure 5C:
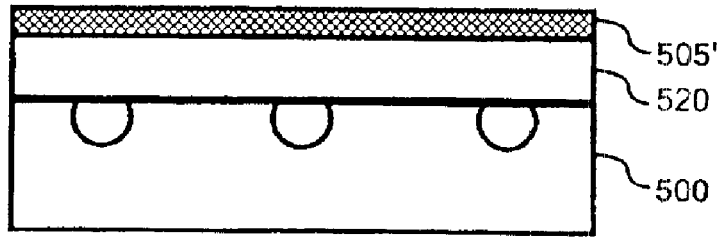

In FIG. 5C, a second layer of insulator material 520 is grown on top of the substrate 500. A second layer of photoresist 505' is placed on top of the second layer of insulator material 520.

Figure 5D:
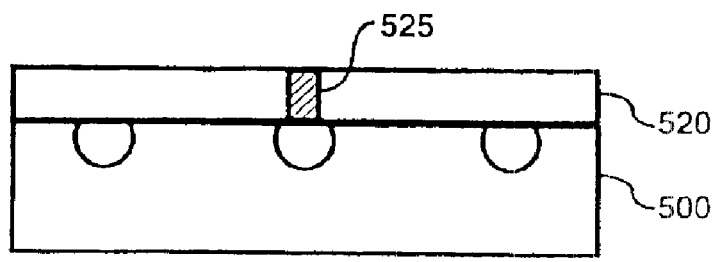

In FIG. 5D, the stepper 400 may expose the second layer of photoresist 505' in accordance to method 300, i.e., expose a via pattern according to a N-bit Gray code. In general, vias provide a method of providing electrical conduction between two different layers of metal. As a result, via 525 may be formed according to N-bit Gray code. In this perspective, only one via 525 is shown for the sake of clarity.

Figure 5E:
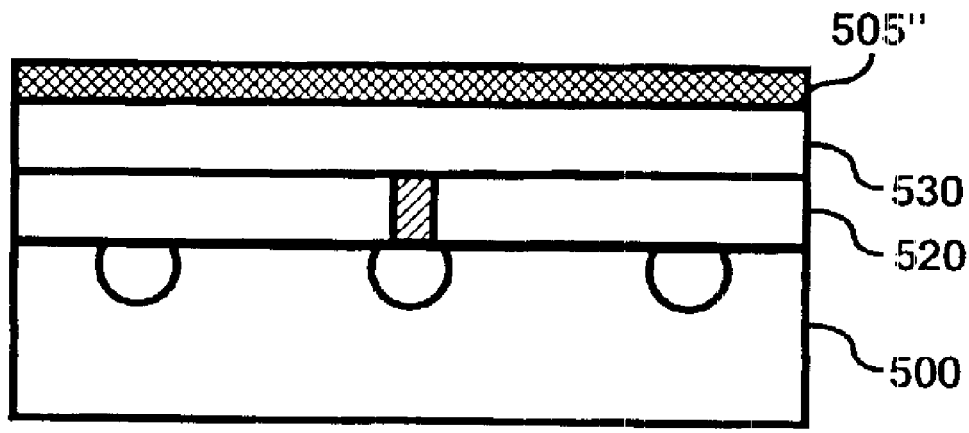

As shown in FIG. 5E, an additional insulator layer 530 may be grown on top of the second insulator layer 515. However, it should be readily to those skilled in the art that the second insulator layer 515 may be grown in another embodiment. A third layer of photoresist 505" has been deposited on the additional insulator layer 530.

Figure 5F:
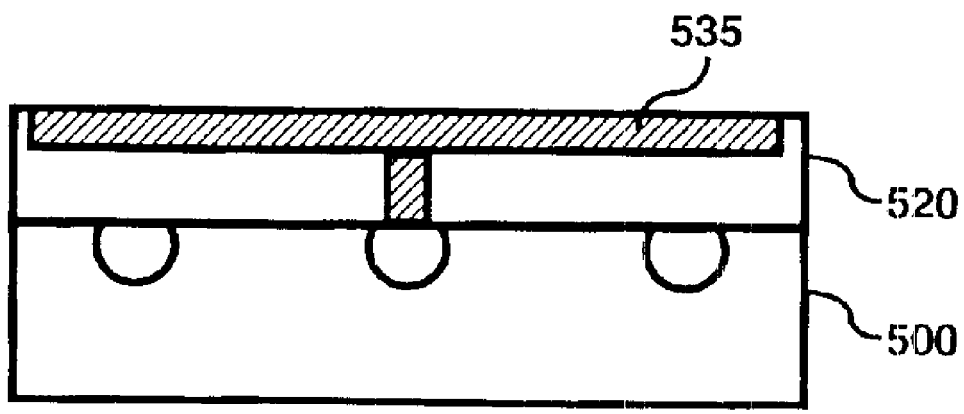

In FIG. 5F, the stepper 400 has exposed the third layer of photoresist 505" to form the metal runs for the other of the address lines. A third layer of metal has been deposited in the etched metal run 535. Again, data wires may be formed in the manner described above.

Certain embodiments of the present invention may be performed as a computer program. The computer program may exist in a variety of forms both active and inactive. For example, the computer program can exist as software program(s) comprised of program instructions in source code, object code, executable code or other formats; firmware program(s); or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the present invention can be configured to access, including signals downloaded through the Internet or other networks. Concrete examples of the foregoing include distribution of executable software program(s) of the computer program on a CD-ROM or via Internet download. In a sense, the Internet itself, as an abstract entity, is a computer readable medium. The same is true of computer networks in general.

By virtue of certain embodiments of the invention, the number of random connections implemented in the fabrication of a nanoscale multiplexer/demultiplexer may be substantially reduced, and in some instances, removed altogether. In one respect, therefore, the number of additional addressing wires may also be reduced. Furthermore, the addressing patterns described hereinabove may avoid locations in the structure at which many addressing bits change simultaneously, thereby relatively reducing the possibilities of fabrication errors, such as, completely missing connecting some of the nanowires, connecting nanowires to both parities of an addressing wire, and the like.

While the invention has been described with reference to certain embodiments thereof, those skilled in the art will be able to make various modifications to the described embodiments of the invention without departing from the scope of the invention. The terms and descriptions used herein are set forth by way of illustration only and are not meant as limitations. In particular, although the method of the present invention has been described by examples, the steps of the method may be performed in a different order than illustrated or simultaneously. Those skilled in the art will recognize that these and other variations are possible within the scope of the invention as defined in the following claims and their equivalents.

What is claimed is:

1. A method of creating connections in nanometer scale devices, comprising:

forming address lines on a wafer;

forming nanometer scale data wires on said wafer; and patterning connections between said address lines and said nanometer scale data wires according to at least one bit change between successive nanometer scale data wires, wherein patterning connections occurs with a nonrandom order.

2. The method according to claim 1, wherein said step of patterning connections comprises patterning the connections between said address lines and said nanometer scale data wires according to Gray code ordering.

3. The method according to claim 1, wherein said step of patterning connections comprises patterning the connections between one or more of a first set of said address lines and said nanometer scale data wires with a first bit change and patterning the connections between one or more of a second set of said address lines and said nanometer scale data wires with a second bit change.

4. The method according to claim 1, further comprising:

fabricating one or more of the connections using lithography.

5. The method according to claim 1, further comprising:

forming a photoresist layer on said wafer; and exposing a layout for said address lines on said photoresist layer.

6. The method according to claim 5, further comprising:

etching said exposed photoresist layer; and depositing a metal layer.

7. The method according to claim 6, wherein said step of forming nanometer scale data wires on said wafer comprises nanoscale fabrication techniques.

8. The method according to claim 7, wherein said nanoscale fabrication techniques comprises self-assembly.

9. The method according to claim 7, further comprising:

depositing an insulator layer;

forming a second photoresist layer on said wafer;

exposing said second photoresist layer to layout said connections;

etching said exposed second photoresist layer; and depositing a second metal layer to create said connections.

10. The method according to claim 9, further comprising:

depositing a second insulator layer;

forming a third photoresist layer on said wafer;

exposing said third photoresist layer to layout said address lines;

etching said exposed third photoresist layer; and depositing a third metal layer to create said address lines.

11. The method of claim 1 wherein the patterning connections occurs such that only one bit changes between successive nanometer scale data wires.

12. The method of claim 1 wherein the patterning connections occurs in a pattern with N-bit changes between adjacent nanometer scale data wires.

13. A computer readable storage medium on which is embedded one or more computer programs, said one or more computer programs implementing a method of creating connections in nanometer scale devices, said one or more computer programs comprising a set of instructions for:

forming address lines on a wafer;

forming nanometer scale data wires on said wafer; and patterning connections between said address lines and said nanometer scale data wires according to at least one bit change between successive nanometer scale data wires, wherein patterning connections occurs with a nonrandom order.

14. The computer readable storage medium according to claim 13, said set of instructions further comprising:

patterning the connections between said address lines and said nanometer scale data wires according to Gray code ordering.

15. The computer readable storage medium according to claim 13, said set of instructions further comprising:

patterning the connections between one or more of said address lines and one or more of said nanometer scale data wires with a first bit change and patterning the connections between one or more of said address lines and one or more of said nanometer scale data wires with a second bit change, wherein said first bit change varies from said second bit change.

16. The computer readable storage medium according to claim 13, said set of instructions further comprising:

fabricating one or more of the connections using lithography.

17. The computer readable storage medium of claim 13 wherein the patterning connections occurs such that only one bit changes between successive nanometer scale data wires.

18. The computer readable storage medium of claim 13 wherein the patterning connections occurs in a pattern with N-bit changes between adjacent nanometer scale data wires.

19. An apparatus for patterning nanometer scale circuits, comprising:

means for forming address lines on a wafer;

means for forming nanometer scale data wires on said wafer; and means for patterning connections between said address lines and said nanometer scale data wires according to at least one bit change between successive nanometer scale data wires, wherein patterning connections occurs with a nonrandom order.

20. The apparatus according to claim 19, further comprising:

means for patterning the connections between said address lines and said nanometer scale data wires according to Gray code ordering.

21. The apparatus according to claim 19, further comprising:

means for patterning the connections between one or more of a first set of said address lines and said nanometer scale data wires with a first bit change and patterning the connections between one or more of a second set of said address lines and said nanometer scale data wires with a second bit change.

22. The apparatus according to claim 19, further comprising:

means for fabricating one or more of the connections using lithography.

23. The apparatus of claim 19 wherein the patterning connections occurs such that only one bit changes between successive nanometer scale datawires.

24. The apparatus of claim 19 wherein the patterning connections occurs in a pattern with N-bit changes between adjacent nanometer scale data wires.

* * * * *